United States Patent
Kim et al.

(10) Patent No.: US 6,913,984 B2
(45) Date of Patent: Jul. 5, 2005

(54) METHOD OF MANUFACTURING MEMORY WITH NANO DOTS

(75) Inventors: In-sook Kim, Yongin (KR); Sun-ae Seo, Seoul (KR); In-kyeong Yoo, Suwon (KR); Soo-hwan Jeong, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/743,377

(22) Filed: Dec. 23, 2003

(65) Prior Publication Data

US 2004/0137704 A1 Jul. 15, 2004

(30) Foreign Application Priority Data

Dec. 23, 2002 (KR) .................................. 10-2002-0082387

(51) Int. Cl.[7] .............................................. H01L 21/76
(52) U.S. Cl. ....................... 438/432; 438/151; 438/201; 257/24; 977/DIG. 1
(58) Field of Search ................................ 438/151, 201, 438/285, 430, 431, 432, 435, 590, 800; 257/24, 65, 66, 192; 977/DIG. 1

(56) References Cited

U.S. PATENT DOCUMENTS 5,608,231 A * 3/1997 Ugajin et al. ................. 257/24
6,753,200 B2 * 6/2004 Craighead et al. ............. 438/48
6,767,771 B2 * 7/2004 Kim ........................... 438/142

* cited by examiner

Primary Examiner—Amir Zarabian
Assistant Examiner—Pamela E Perkins
(74) Attorney, Agent, or Firm—Lee & Morse, P.C.

(57) ABSTRACT

A method of fabricating memory with nano dots includes sequentially depositing a first insulating layer, a charge storage layer, a sacrificial layer, and a metal layer on a substrate in which source and drain electrodes are formed, forming a plurality of holes on the resultant structure by anodizing the metal layer and oxidizing portions of the sacrificial layer that are exposed through the holes, patterning the charge storage layer to have nano dots by removing the oxidized metal layer, and etching the sacrificial layer and the charge storage layer using the oxidized sacrificial layer as a mask, and removing the oxidized sacrificial layer, depositing a second insulating layer and a gate electrode on the patterned charge storage layer, and patterning the first insulating layer, the patterned charge storage layer, the second insulating layer, and the gate electrode to a predetermined shape, for forming memory having uniformly distributed nano-scale storage nodes.

8 Claims, 7 Drawing Sheets

METHOD OF MANUFACTURING MEMORY WITH NANO DOTS

BACKGROUND OF THE INVENTION

1. Field of the Invention

The present invention relates to a method of manufacturing memory with nano dots. More particularly, the present invention relates to a method of manufacturing memory with nano dots using self-alignment.

2. Description of the Related Art

Currently, much attention and effort are being placed on the development of nano-scale devices to be included in apparatuses such as memory, laser diodes (LDs), photo diodes, transistors, far-ultraviolet detectors, solar batteries, and optical modulators. A number of electrons that are captured in a nanodevice depends on the size of nano dots. Nanodevices may be driven with a smaller amount of electrons than conventional devices, thereby lowering a threshold current. Therefore, a nanodevice can be driven by a low voltage and still produce a high output.

Conventionally, nano dots are made by forming an atomic nucleus with Si or $Si_3N_4$ using a general deposition method such as low-pressure chemical vapor deposition (LPCVD), or by spraying nano particles over a substrate. However, this method is disadvantageous in that it is difficult to appropriately adjust sizes of the nano particles and, even if same-sized nano particles are selected and sprayed onto the substrate, it is difficult to obtain a uniform distribution of nano dots.

The information communication technology of today requires techniques of storing, processing, and transmitting large capacities of tera-class information at high speeds. In particular, nano dots should be reduced in size to several nanometers each in order to store a large capacity of information. Also, a technique of forming a uniform distribution of nano dots is required to realize high-performance memory.

SUMMARY OF THE INVENTION

The present invention provides a method of manufacturing memory with several-nm nano dots in order to realize a large capacity of memory.

According to a feature of an embodiment of the present invention, there is provided a method of fabricating memory with nano dots, the method including (a) sequentially depositing a first insulating layer, a charge storage layer, a sacrificial layer, and a metal layer on a substrate in which source and drain electrodes are formed, (b) forming a plurality of holes on the resultant structure by anodizing the metal layer and oxidizing portions of the sacrificial layer that are exposed through the holes, (c) patterning the charge storage layer to have nano dots by removing the oxidized metal layer, and etching the sacrificial layer and the charge storage layer using the oxidized sacrificial layer as a mask and (d) removing the oxidized sacrificial layer, depositing a second insulating layer and a gate electrode on the patterned charge storage layer, and patterning the first insulating layer, the patterned charge storage layer, the second insulating layer, and the gate electrode to a predetermined shape.

The charge storage layer may be formed of a material selected from the group consisting of Si, $Si_3N_4$, and $Al_2O_3$.

It is preferable that the sacrificial layer is formed of Ta and the metal layer is formed of Al or Al alloy.

The first and second insulating layers may be formed of $Si_3N_4$ and $Al_2O_3$, respectively.

It is preferable that during (a), the first insulating layer, the charge storage layer, the sacrificial layer, the metal layer, and the second insulating layer are deposited by chemical vapor deposition (CVD), sputtering or evaporation.

It is preferable that during (c), the charge storage layer is patterned to have a dot array structure in which a plurality of cylinders are arranged, the cylinders being shaped like nano dots. The cylinders, which are shaped like nano-dots, may be arranged to form a honeycomb structure.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1A:
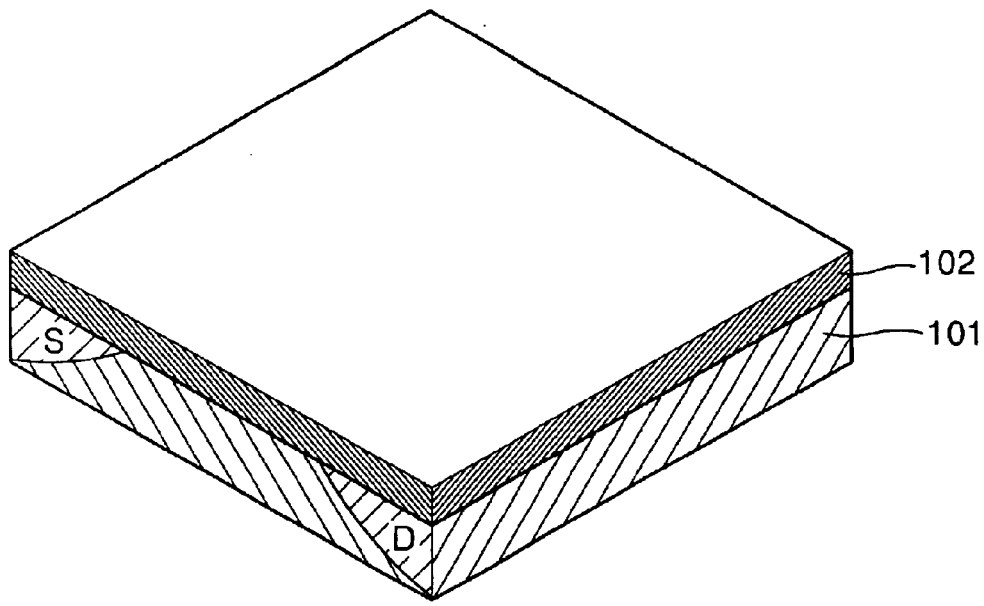
FIGS. 1A through 1K illustrate cross-sectional views of a method of fabricating memory according to a preferred embodiment of the present invention.

Korean Patent Application No. 2002-82387, filed on Dec. 23, 2002, and entitled, "Method Of Manufacturing Memory With Nano Dots," is incorporated by reference herein in its entirety.

The present invention will be described more fully hereinafter with reference to the accompanying drawings, in which preferred embodiments of the invention are shown. The invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout A method of fabricating memory with nano dots according to a preferred embodiment of the present invention will now be described with reference to the accompanying drawings.

Figure 1B:
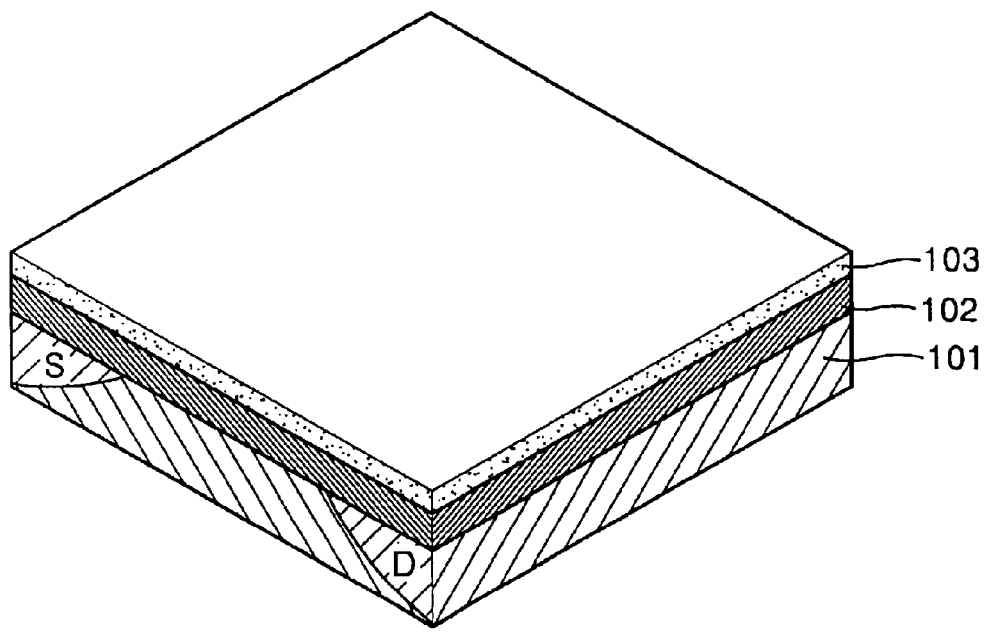
Figure 1C:
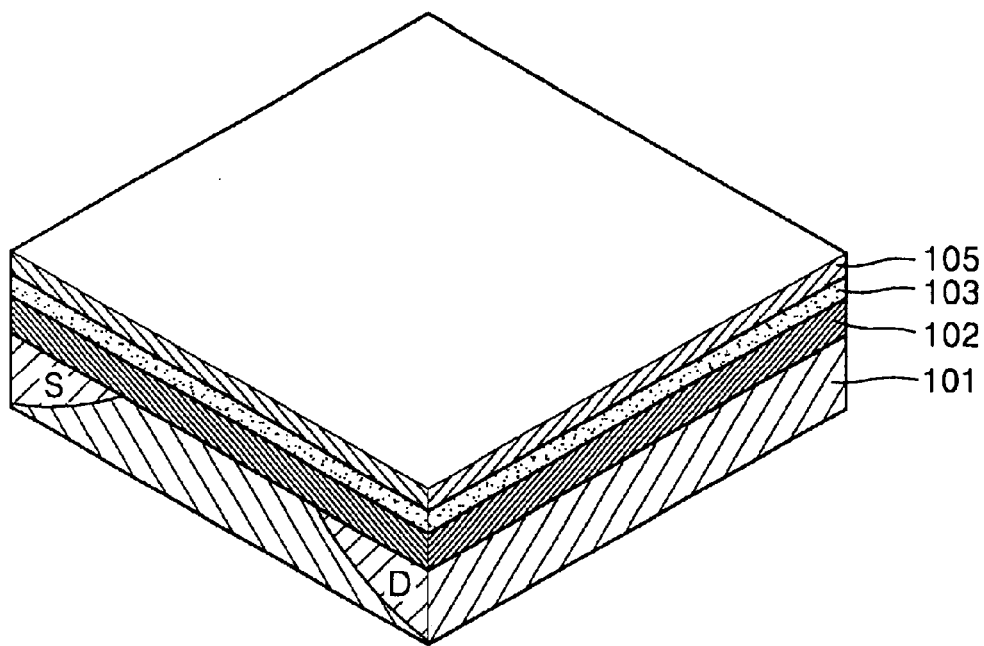
Figure 1D:
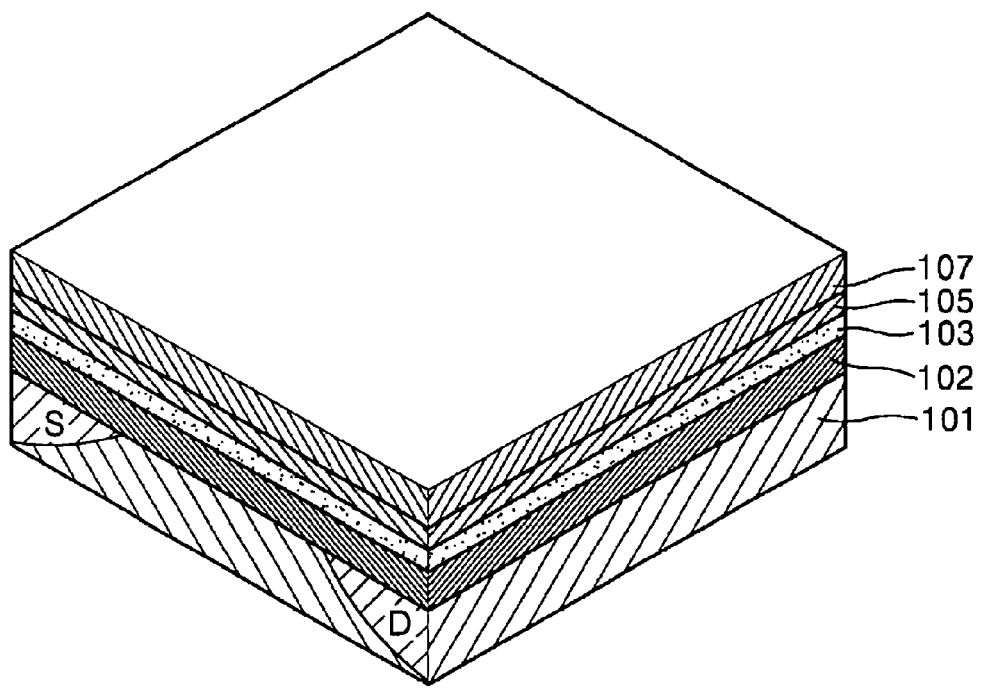
Figure 1E:
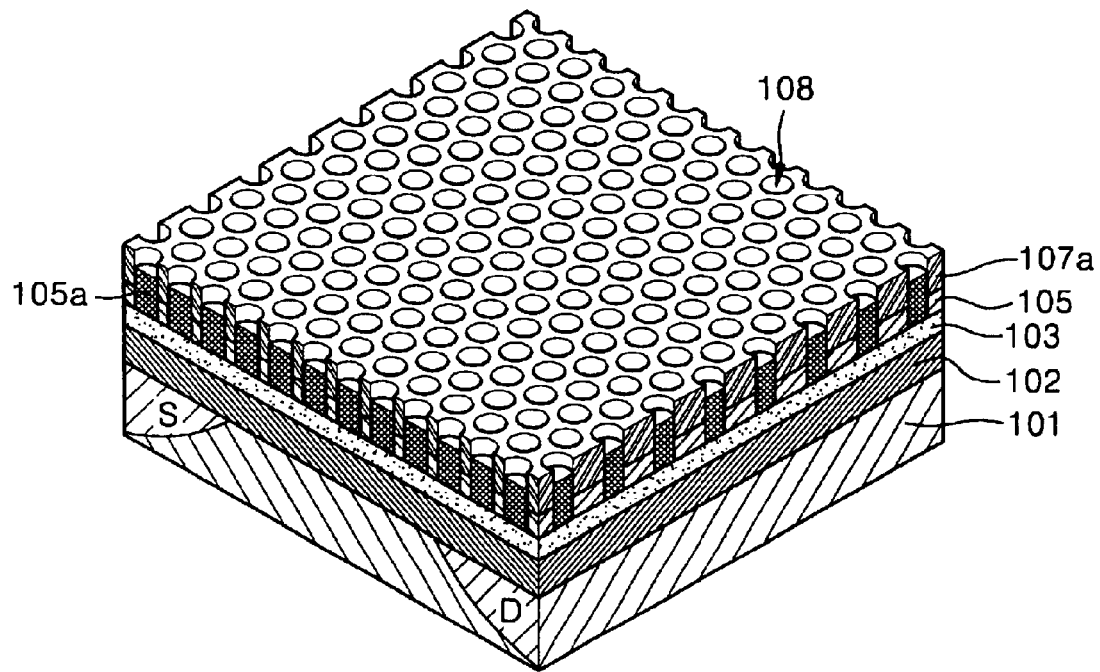
Figure 1F:
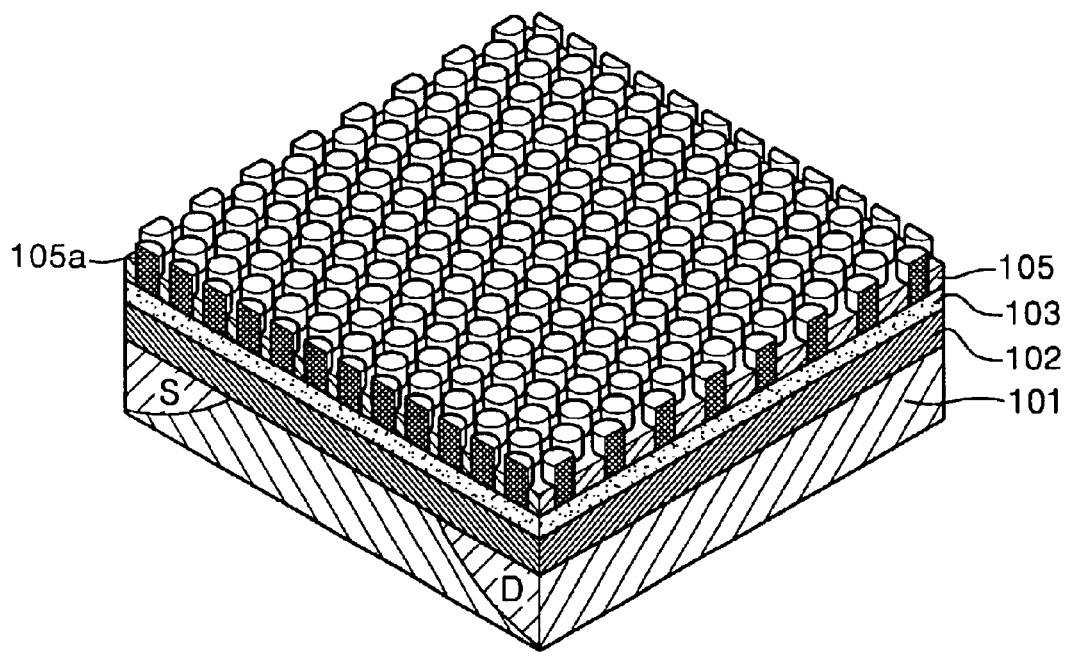
Figure 1G:
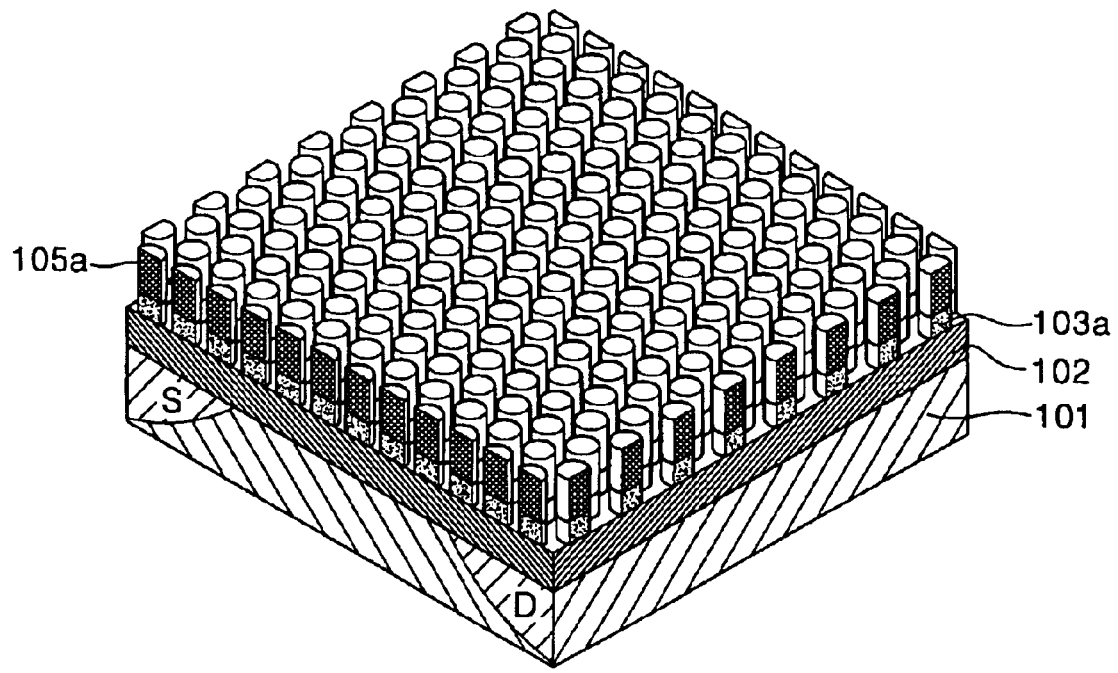
Figure 1H:
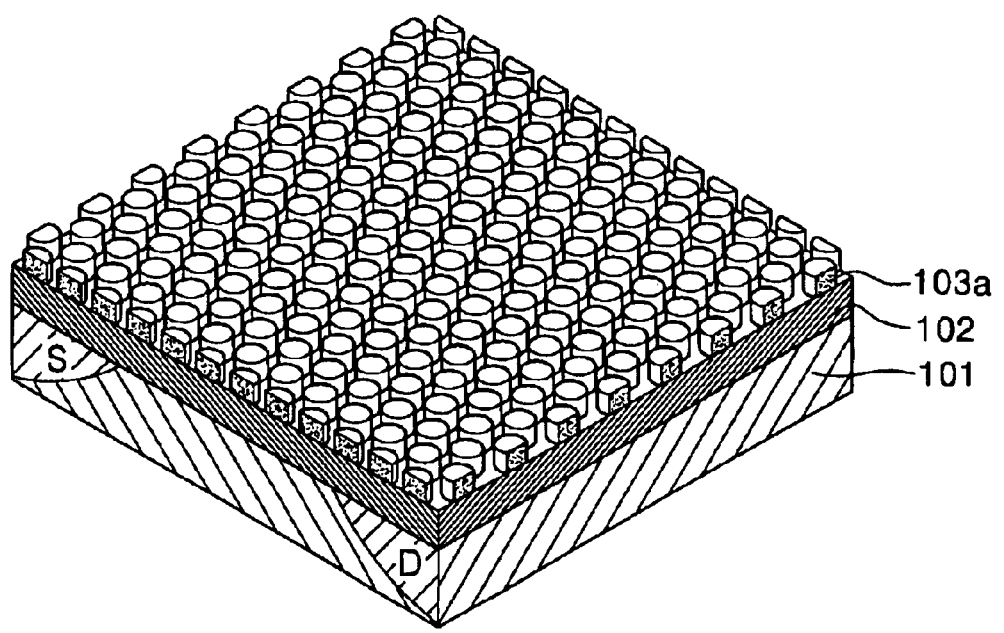
Figure 1I:
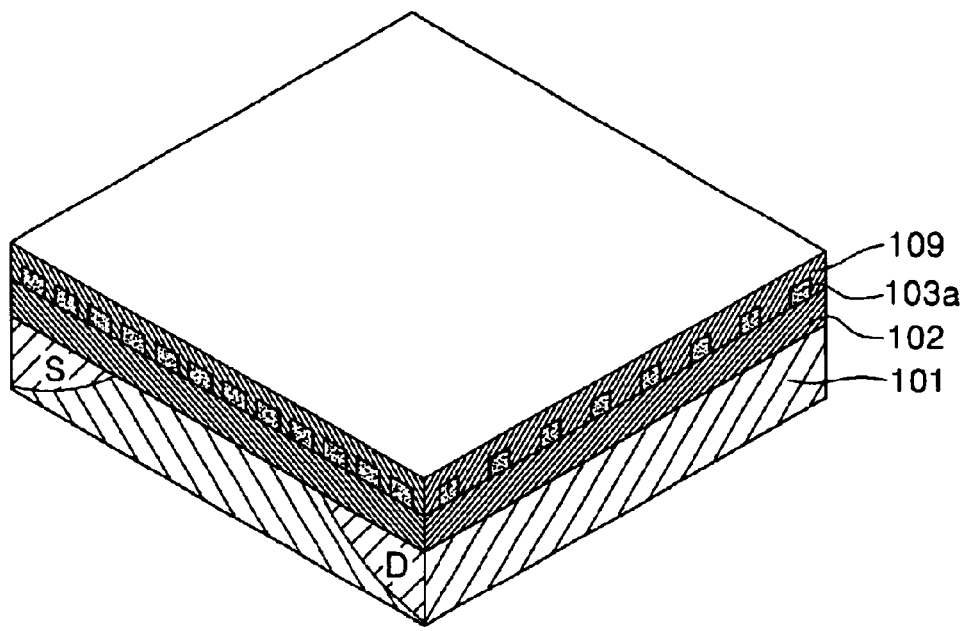
Figure 1J:
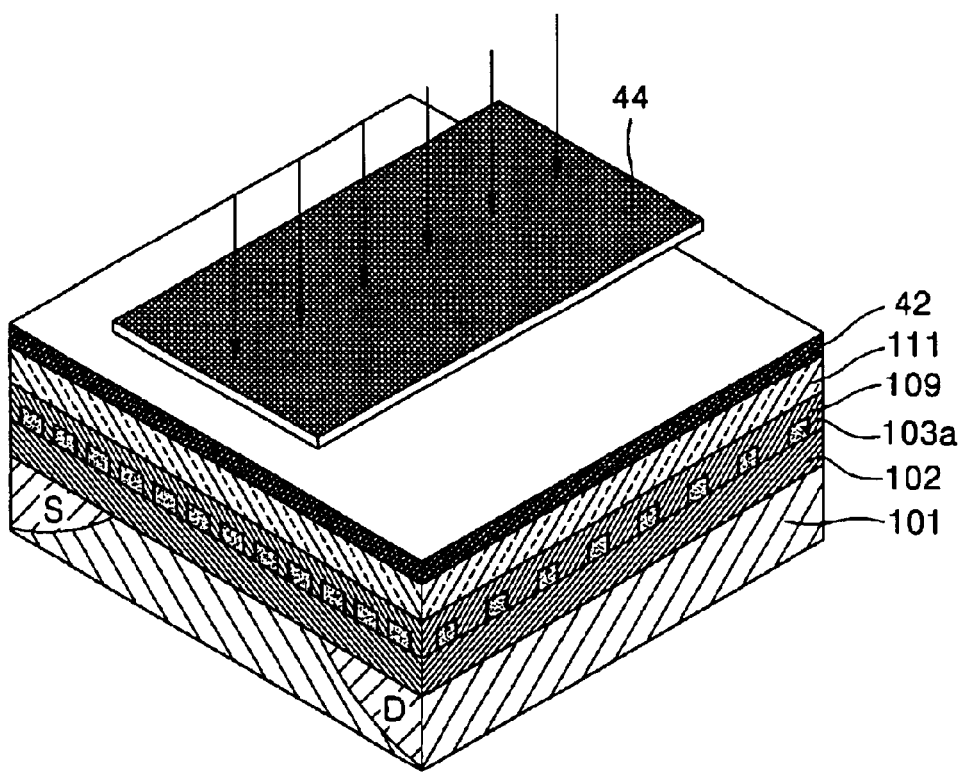
Figure 1K:
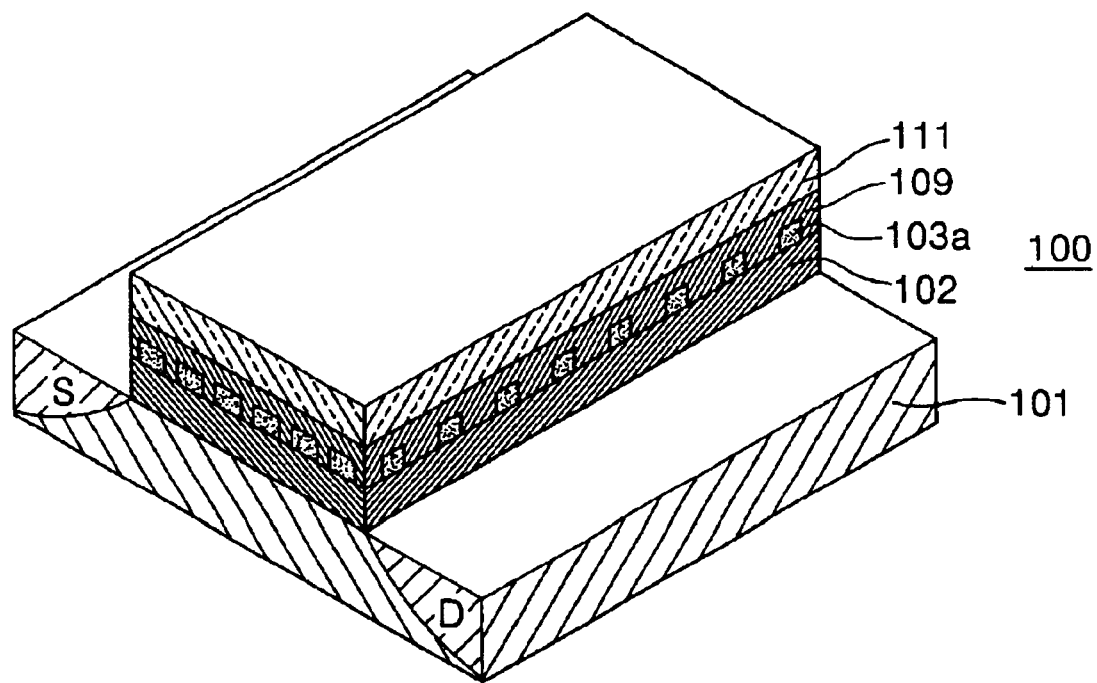

FIGS. 1A through 1K are cross-sectional views illustrating a method of fabricating memory with nano dots according to a preferred embodiment of the present invention. The method includes forming nano dots, which is illustrated in FIGS. 1A through 1H, and fabricating memory with nano dots to complete a transistor structure, which is illustrated in FIGS. 1I through 1K.

More specifically, as shown in FIG. 1A, a first insulating layer 102 is deposited on a substrate 101 in which source and drain electrodes S and D are formed. Next, a charge storage layer 103 is deposited on the first insulating layer 102 using a charge storage material such as Si, $Si_3N_4$, or $Al_2O_3$, as shown in FIG. 1B. Referring to FIG. 1C, a sacrificial layer 105 is deposited on the charge storage layer 103 using metal such as Ta. Next, referring to FIG. 1D, a metal layer 107 is deposited on the sacrificial layer 105 using metal such as Al. The first insulating layer 102, the charge storage layer 103, the sacrificial layer 105, and the metal layer 107 are formed using a thin film deposition method such as chemical vapor deposition (CVD), sputtering, or evaporation.

Referring to FIG. 1E, an oxide metal layer 107a having a plurality of holes 108 is formed by anodizing the metal layer 107 shown in FIG. 1D. During the anodization, portions of the sacrificial layer 105, which are exposed through the holes 108, are oxidized by an oxidant to be changed into a patterned oxide sacrificial layer 105a, and grown to a certain degree in the holes 108. For example, if the metal layer 107 of FIG. 1D is formed of Al, the oxide metal layer 107a changes into an $Al_2O_3$ layer, and if the sacrificial layer 105 is formed of Ta, the patterned oxide sacrificial layer 105a changes into a $Ta_2O_5$ layer. The holes 108, which are circular shaped, are formed in a dot array structure, e.g., a honeycomb structure, such that they are uniformly and densely arranged to maximize their surface areas.

Next, referring to FIG. 1F, the oxide metal layer 107a is removed so that the sacrificial layer 105 and the patterned oxide sacrificial layer 105a entirely remain on the charge storage layer 103. Thereafter, portions of the sacrificial layer 105, which are exposed between the patterned oxide sacrificial layer 105a, and portions of the charge storage layer 103 below the portions of the sacrificial layer 105 are etched using the patterned oxide sacrificial layer 105a as a mask, by ion milling or reactive ion etching (RIE). As a result, the charge storage layer 103 is patterned to have a nano dot array structure that is shaped like a honeycomb, as shown in FIG. 1G as patterned charge storage layer 103a.

Next, the patterned oxide sacrificial layer 105a on the patterned charge storage layer 103a is etched so that only the patterned charge storage layer 103a remains, as shown in FIG. 1H. Then, a second insulating layer 109 is deposited on the patterned charge storage layer 103a using CVD or sputtering.

Next, as shown in FIG. 1J, a gate electrode 111 is deposited on the second insulating layer 109 and photolithography is performed on the resultant structure. In detail, a photosensitive material 42 is applied onto the gate electrode 111 and a mask 44 is placed over the photosensitive material 42. Next, when exposure, development, and etching are performed on the resultant structure, the first and second insulating layers 102 and 109, the patterned charge storage layer 103a, and the gate electrode 111 are patterned to have a strip shape as shown in FIG. 1K. Here, the gate electrode 111 is formed of a conductive material such as polysilicon. When the processes explained with reference to FIGS. 1A through 1K are complete, a memory with nano dots is obtained.

Nonvolatile memory devices, in which data may be electrically stored and erased, and in which data is not lost when a power supply is disrupted, have various applications. For instance, flash memory and silicon-oxide-nitride-oxide-silicon (SONOS) memory are developed using nonvolatile memory devices. They are two general types of flash memory: a NOR type flash memory in which cells are arranged in parallel between a bit line and ground, and a NAND type flash memory in which cells are arranged in series between a bit line and ground.

A memory with nano dots according to the present invention may be embodied as a flash memory by using the patterned charge storage layer 103a as a floating gate.

As the capacity of memory becomes larger and a circuit structure of memory becomes more complicated, a number of gate arrays required in a memory becomes larger and development of a finer patterning technique is required. Therefore, general stack gate-type nonvolatile memory cells are being developed to be smaller and smaller, but there is a limit to how much their sizes may be reduced using photolithography and etching. However, a method of fabricating memory with nano dots according to the present invention makes it easy to manufacture a large capacity of nonvolatile flash memory without requiring a high degree of skill such as is necessary with photolithography and etching.

Figure 2:
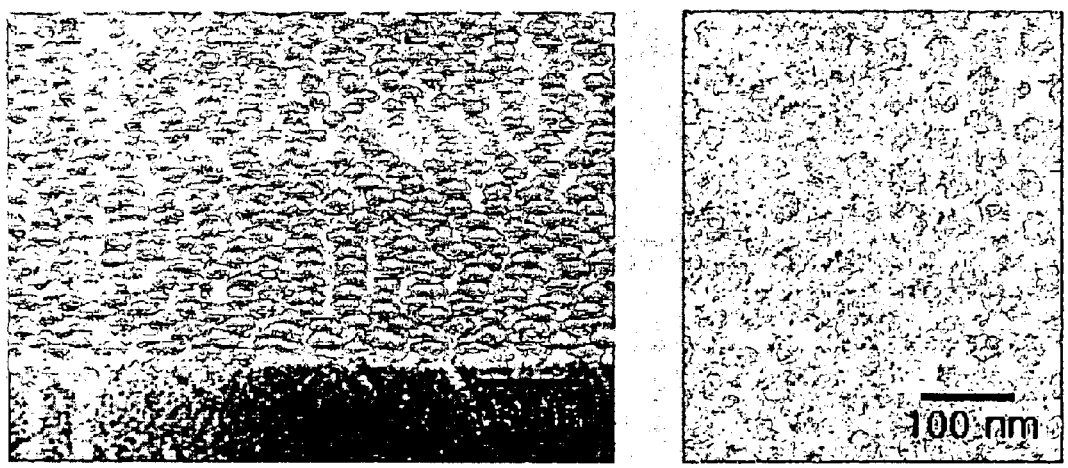
FIG. 2 is a photograph taken by a scanning electron microscope (SEM) showing nano dots formed in memory that is fabricated using a memory fabrication method according to the present invention.

FIG. 2 is a photograph taken by a scanning electron microscope (SEM) showing nano dots in memory that are formed by etching the charge storage layer 103 of FIG. 1B using a nano-class Ta and $Ta_2O_5$ cylindrical structure as a mask, according to a preferred embodiment of the present invention. Referring to FIG. 2, nano dots having diameters of 20–25 nm and heights of 5–15 nm are uniformly distributed in the memory. However, the nano dots shown in FIG. 2 are illustrative of the present invention and the sizes of nano dots according to the present invention may be determined within a range of from several nm to several dozen nm.

As described above, according to the present invention, it is possible to easily fabricate memory with nano dots using a sacrificial layer and self-alignment including anodic oxidation. Also, it is possible to make a large capacity memory with uniformly distributed nano dots having a size of from several nm to several dozen nm, in which the smaller the size of the nano dot, the lower the memory driving voltage, and the higher the performance of the memory.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating memory with nano dots, the method comprising:
   (a) sequentially depositing a first insulating layer, a charge storage layer, a sacrificial layer, and a metal layer on a substrate in which source and drain electrodes are formed;
   (b) forming a plurality of holes on the resultant structure by anodizing the metal layer and oxidizing portions of the sacrificial layer that are exposed through the holes;
   (c) patterning the charge storage layer to have nano dots by removing the oxidized metal layer, and etching the sacrificial layer and the charge storage layer using the oxidized sacrificial layer as a mask; and
   (d) removing the oxidized sacrificial layer, depositing a second insulating layer and a gate electrode on the patterned charge storage layer, and patterning the first insulating layer, the patterned charge storage layer, the second insulating layer, and the gate electrode to a predetermined shape.

2. The method as claimed in claim 1, wherein the charge storage layer is formed of a material selected from the group consisting of Si, $Si_3N_4$, and $Al_2O_3$.

3. The method as claimed in claim 1, wherein the sacrificial layer is formed of Ta.

4. The method as claimed in claim 1, wherein the metal layer is formed of Al or Al alloy.

5. The method as claimed in claim 1, wherein the first and second insulating layers are formed of $Si_3N_4$ and $Al_2O_3$, respectively.

6. The method as claimed in claim 1, wherein during (a), the first insulating layer, the charge storage layer, the sacrificial layer, the metal layer, and the second insulating layer are deposited by chemical vapor deposition (CVD), sputtering, or evaporation.

7. The method as claimed in claim 1, wherein during (c), the charge storage layer is patterned to have a dot array structure in which a plurality of cylinders are arranged, the cylinders being shaped like nano dots.

8. The method as claimed in claim 7, wherein the cylinders, which are shaped like nano dots, are arranged to form a honeycomb structure.

* * * * *